(12) United States Patent
Konecny et al.

(10) Patent No.: US 8,508,298 B2
(45) Date of Patent: Aug. 13, 2013

(54) AMPLIFIER USING MASTER-SLAVE CONTROL SCHEME

(75) Inventors: Pavel Konecny, San Jose, CA (US); Jinwen Xiao, Los Altos, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/045,279

(22) Filed: Mar. 10, 2011

(65) Prior Publication Data
US 2012/0229212 A1 Sep. 13, 2012

(51) Int. Cl.
*H03F 3/217* (2006.01)

(52) U.S. Cl.
USPC .......................... 330/251; 330/207 A (58) Field of Classification Search
USPC ................. 330/251, 207 A, 10, 262, 146
See application file for complete search history.

(56) References Cited

U.S. PATENT DOCUMENTS

| | | | | |
|---|---|---|---|---|
| 5,904,706 A * | 5/1999 | Ayati et al. | ......................... | 607/5 |
| 6,198,335 B1 * | 3/2001 | Pakriswamy | ................. | 327/423 |
| 6,608,445 B2 * | 8/2003 | Melvin et al. | ................... | 315/82 |
| 7,271,655 B2 * | 9/2007 | Berkhout | ....................... | 330/269 |
| 2006/0061419 A1 * | 3/2006 | Edwards | ....................... | 330/251 |
| 2010/0013555 A1 * | 1/2010 | Berkhout | ....................... | 330/251 |

OTHER PUBLICATIONS

"MP8042 High Current, Dual Channel Power Half-Bridge," MPS The Future of Analog IC Technology: Initial Release—Specifications Subject to Change, MP8042 Rev. 0.9, May 23, 2006, 9 pages.
"20-W Stereo Digital Audio Power Amplifier with EQ and DRC," Texas Instruments Incorporated: TAS5709, TAS5709A, SLOS599A—Nov. 2008—revised Sep. 2009, 59 pages.

* cited by examiner

*Primary Examiner* — Henry Choe (57) ABSTRACT

Techniques are disclosed relating to charging and discharging gates of transistors. In one embodiment, an apparatus includes first and second drivers. The first driver is configured to discharge a gate of a first transistor, and to send a charge indication to the second driver in response to reaching a Miller plateau for the first transistor. The second driver is configured to charge a gate of a second transistor above a threshold voltage in response to receiving the charge indication. In some embodiments, the second driver is configured to begin charging the gate of the second transistor to a voltage below the threshold voltage when the first driver begins discharging the gate of the first transistor begins, and to wait to charge the gate of the second transistor above the threshold voltage until the charge indication has been received.

19 Claims, 8 Drawing Sheets

AMPLIFIER USING MASTER-SLAVE CONTROL SCHEME

BACKGROUND

1. Technical Field

This disclosure relates generally to integrated circuits, and, more specifically, to controlling transistors in amplifier circuits.

2. Description of the Related Art

Developers may consider a variety of design objectives when creating an amplifier (such as a class D amplifier). Some objectives may include:

1. Adjustable pulse-width modulation (PWM) output edge dV/dt to mitigate electromagnetic interference (EMI) by decreasing dV/dt;
2. Small propagation delay variation with load current to reduce total harmonic distortion (THD);
3. Propagation delay linearly dependant on load current to reduce THD;
4. Small absolute value of propagation delay for a higher usable modulation index and better total harmonic distortion plus noise (THD+N) performance of a potential feedback loop;
5. Minimum shoot-through current for better efficiency and to lower on-chip heat dissipation; and
6. Minimum dead time to reduce THD.

A problem with some of these design objectives is that they can be contradictory. For example, if dV/dt is decreased in order to provide more mitigation of electromagnetic interference (design objective #1), other design objectives (e.g., objectives #2, 4, and 5) may become negatively impacted.

SUMMARY

The present disclosure describes various embodiments of methods and structures, which may, in some embodiments, reduce shoot-through current in an amplifier.

In one embodiment, an apparatus is disclosed that includes first and second drivers. The first driver is configured to discharge a gate of a first transistor. The first driver is configured to send a charge indication to the second driver in response to reaching a Miller plateau for the first transistor. The second driver is configured to charge a gate of a second transistor above a threshold voltage in response to receiving the charge indication.

In another embodiment, an apparatus is disclosed that includes an amplifier. The amplifier is configured to use first and second transistors to drive an output at a node. The amplifier is configured to discharge a gate of the first transistor. The amplifier is configured to charge a gate of a second transistor above a threshold voltage in response to reaching a Miller plateau for the first transistor.

In yet another embodiment, a method is disclosed. The method includes a first driver of an amplifier discharging a gate of a first transistor. The method further includes the first driver sending a charge indication to a second driver of the amplifier in response to reaching a Miller plateau for the first transistor. The method further includes the second driver charging a gate of a second transistor above a threshold voltage in response to receiving the charge indication.

DETAILED DESCRIPTION

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology.

The following paragraphs provide definitions and/or context for terms found in this disclosure (including the appended claims):

"Comprising." This term is open-ended. As used in the appended claims, this term does not foreclose additional structure or steps. Consider a claim that recites: "An apparatus comprising one or more processor units . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, in a processor having eight processing elements or cores, the terms "first" and "second" processing elements can be used to refer to any two of the eight processing elements. In other words, the "first" and "second" processing elements are not limited to logical processing elements 0 and 1.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Miller Plateau." As used herein, this term has its ordinary and accepted meaning in the art, and includes a flat gate-to-source voltage as a function of time for a transistor in the saturation region, where the drain-to-source voltage moves up or down at a relatively constant rate dV/dt (see, e.g., FIGS. 3, 5, and 7 described below).

The present disclosure describes various techniques to improve operation of amplifiers. In some instances, such techniques may reduce the output PWM edge dV/dt while minimizing negative impact on other design objectives and without having a significant impact on silicon area or circuit complexity.

As will be described below, in various embodiments, an amplifier may include one or more drivers that are configured to control the operation of one or more respective transistors by charging and discharging the gates of the transistors. In one embodiment, a driver is disclosed that is configured to discharge a gate of a transistor at a first rate until reaching a Miller plateau for the transistor. The driver is configured to then discharge the gate at a second rate (less than the first rate) after reaching the Miller plateau. By discharging the transistor's gate a faster initial rate, the amplifier may produce pulses that have a shorter and more-linear propagation delay in many instances. As a result, the amplifier may experience reduced total harmonic distortion plus noise.

In one embodiment, a driver is disclosed that is configured to charge a gate of a transistor in a similar manner. That is, the driver may be configured to charge a gate of the transistor at a first rate until reaching a Miller plateau for the transistor, and to charge the gate at a second, lesser rate after reaching the Miller plateau. Charging a gate of transistor in this manner may further reduce total harmonic distortion plus noise in some instances.

In one embodiment, a pair of drivers is disclosed that are configured to coordinate charging and discharging with one another. In one embodiment, a first of the drivers is configured to discharge a gate of a first transistor, and to send a charge indication to a second of the drivers in response to reaching a Miller plateau for the first transistor. The second driver is configured to charge a gate of a second transistor above a threshold voltage in response to receiving the charge indication. In some embodiments, the second driver is configured to begin charging the gate of the second transistor to a value below the threshold voltage when the first driver begins discharging the gate of the first transistor. The second driver is configured to then wait to charge the gate of the second transistor above the threshold voltage until the charge indication has been received. By coordinating charging and discharging in this manner, drivers can reduce shoot-through current in the amplifier. In many instances, reducing shoot-through current can reduce the amplifier's power consumption and heat production.

Figure 1:
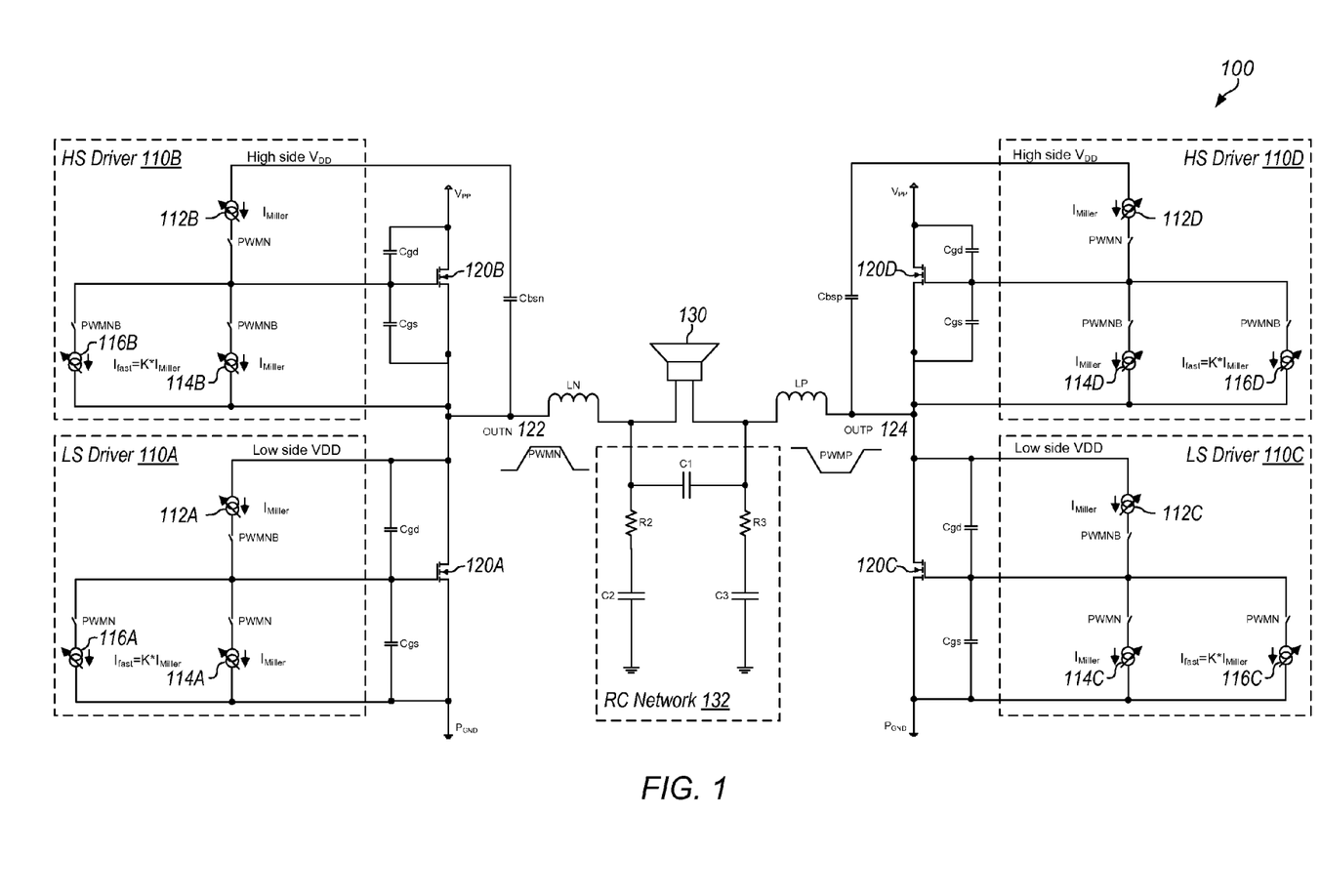
FIG. 1 is a block diagram illustrating one embodiment of an amplifier.

Turning now to FIG. 1, a block diagram of an amplifier 100 is depicted. Amplifier 100 is one embodiment of amplifier that implements one or more of the techniques described above. In the illustrated embodiment, amplifier 100 includes a set of drivers 110A-D coupled to transistors 120A-D arranged in an H bridge. Each driver 110 includes a current source 112 (shown as producing a current $I_{Miller}$) a current source 114 (shown as producing a current $I_{Miller}$) and a current source 116 (shown as producing a current $I_{fast}$). Drivers 110 further include switches PWMN and PWMNB. Transistors 120, in turn, are coupled to an output device 130 via output nodes 122 and 124, and to respective capacitors $C_{gd}$ and $C_{gs}$. Transistors 120 A and C are coupled to respective grounds $P_{GND}$. Transistors 120B and D are coupled to respective voltage sources $V_{PP}$ and capacitors $C_{bsn}$ and $C_{bsp}$, respectively. Output device 130, in turn, is coupled to a resistor-capacitor (RC) network 132 and inductors LN and LP. RC network 132 includes a capacitors 1-3 and resistors 2 and 3. (It is noted that output device 130, RC network 132, and/or inductors LN and LP may not be considered as part of amplifier 100 in various embodiments.)

Amplifier 100 may be any suitable type of amplifier. In the illustrated embodiment, amplifier 100 is a class D amplifier (also referred to as a "digital amplifier" or a "switching amplifier") that is configured to generate a differential output signal via an H bridge. In another embodiment, amplifier 100 may include half of the H bridge and generate a non-differential output signal—e.g., amplifier 100 may include drivers 110A and 110B, but couple node 124 to a ground. In various embodiments, amplifier 100 is configured to produce an output signal by generating a series of pulses from a digital input signal to represent an analog output signal. For example, in one embodiment, amplifier 100 may use pulse density modulation (PDM) in which higher analog values may be represented as a set of pulses placed in close succession and lower analog values may be represented as a set of sparsely placed pulses. In another embodiment, amplifier 100 may use pulse width modulation (PWM) in which higher analog values may be represented as one or more longer pulses and lower analog values may be represented as one or more shorter pulses.

Output device 130 may also be any suitable device, which uses a regulated power supply. In the illustrated embodiment, output device 130 is depicted as a speaker. In another embodiment, output device 130 may be a light source such as a light-emitting diode (LED). In some embodiments, output device 130 may be an antenna for transmitting signals. In one embodiment, if amplifier 100 includes only half of a Class-D H-bridge output stage (e.g., node 124 grounded), amplifier 100 may implement a DC-DC buck power converter usable by output device 130. Accordingly, RC network 132 may be configured differently than shown.

Drivers 110, in one embodiment, are configured to receive an input signal via switches PWMN and PWMNB, and to control transistors 120 to generate a corresponding differential output signal at output nodes 122 and 124. In the illustrated embodiment, low-side (LS) driver 110A and high side (HS) driver 110B handle generation of the lower portion (e.g., the negative portion) of the differential output signal, and LS driver 110C and HS driver 110D handle generation of the higher portion (e.g., the positive portion) of the differential output signal. In various embodiments, the actions performed by high-side and low-side drivers 110 for a PWM falling edge may be identical to those performed during a PWM rising edge, but the actions of high-side and low-side drivers 110 are swapped.

To a control transistor 120, a driver 110, in one embodiment, is configured to charge and discharge a gate of that transistor 120 using a current source 112 and current sources 114 and 116, respectively. (In the illustrated embodiment, current sources 112-116 are depicted as adjustable current sources. In other embodiments, ones of current sources 112-116 may be non-adjustable—i.e., they may be configured to provide only a particular amount of current.) As will be described below, in various embodiments, drivers 110 may be configured to charge and discharge the gates of transistors 120 at multiple, different rates. In one embodiment, a driver 110 is configured to discharge a gate at a faster initial rate, by using current sources 114 and 116 to discharge the gate until reaching a Miller plateau for the transistor 120. The driver 110 is configured to then discharge the gate at a slower subsequent rate, by using only current source 114 after reaching the Miller plateau. In some embodiments, current source 116 may be configured to produce a current $I_{fast}$ that is greater than the current $I_{Miller}$ produced by current source 114 by a multiple of K (e.g., 10 or more, in some embodiments). In one embodiment, a driver 110 is configured to charge a gate of transistor 120 in a similar manner, by using current source 112 and a fast charge circuit (described in conjunction with FIG. 8). In various embodiments, drivers 110 may be configured to coordinate the charging and discharging of gates so that both high-side and low-side transistors 120 enter the saturation region and the output at nodes 122 and 124 slew with dv/dt controlled by current sources 112 and 114. In one embodiment, drivers 110 are further configured to coordinate the charging and discharging of gates to prevent a shoot-through current from passing from $V_{PP}$ to $P_{GND}$. Shoot-through current happens when transistors 120A and 120B are ON (i.e., passing current from drain to source—as opposed to being OFF in which little or no current passes through from drain to source) at the same time or when 120C and 120D are ON at the same time. In this case, the current is bypassing the load and being dissipated on-chip (wasted). In all other cases (combinations of 120A-D being ON/OFF), the current flows through the load, which is preferable in order to have good power efficiency and low electromagnetic interference.

Transistors 120, in one embodiment, are configured to generate an output signal at nodes 122 and 124 by coupling the nodes to voltages sources $V_{PP}$ or grounds $P_{GND}$. In one embodiment, transistors 120 may be N-type metal-oxide-silicon field-effect transistors (MOSFETs) that have equivalent widths and lengths (capacitors $C_{gd}$ may also be equivalent as well). In the illustrated embodiment, transistors 120A and 120C lower the voltages at output node 122 and 124, respectively, by coupling them to grounds $P_{GND}$. Transistors 120B and 120D raise the voltages at output nodes 122 and 124, respectively, by coupling them to sources $V_{PP}$. To generate a pulse, transistors 120A and 120B, in one embodiment, initially lower the voltage at node 122, and transistors 120C and 120D initially raise the voltage at node 124. Transistors 120A and 120B then raise the voltage at node 122, and transistors 120C and 120D then lower the voltage at node 124. As discussed above, controlling the rise and fall time (i.e., the dV/dt) of such a pulse may be desirable, e.g., to mitigate electromagnetic interference.

Without using current sources 116 (described more below), one way to drive an H-bridge power stage of amplifier 100 and at the same time to control (dV/dt) at nodes 122 and 124 (i.e., the PWM output) is to merely use current sources 112 and 114 to charge and discharge the gates of transistors 120. A problem with this approach is that capacitors $C_{gd}$ may be smaller than $C_{gs}$, in some instances—this may be especially true for high voltage processes (such as those used to drive a speaker), where $C_{gd}$ may be an order of magnitude smaller than $C_{gs}$. To illustrate this problem, consider an example in which $V_{PP}$ may be about 20V, in some embodiments, in order to deliver a peak output power around 20 W into an 8 ohm speaker; similarly $V_{PP}$ may be about 10V for a peak output power around 5 W. The H-bridge may also have the properties: $V_{PP}$=10V, $C_{gd}$=10 pF, $C_{gs}$=200 pF, $V_{DD}$=5V, $V_{th}$=1V (Power Mosfet threshold voltage). The target may also be $T_{edge}$=$T_{rise}$=$T_{fall}$=10 ns (10% to 90% rise and fall time at output nodes 122 and 124). If, in this example, current sources 112 and 114 produce a current $I_{Miller}$=0.8*Vpp*Cgd/$T_{edge}$=8 mA, the propagation delay is $T_{pdel}$ ($V_{DD}$−$V_{th}$)*$C_{gs}$/$T_{edge}$/2=100 ns+5 ns=105 ns. In some instances, a propagation delay of 105 ns is too high and limits the usable PWM modulation index at $F_{pwm}$=1 MHz to M<=89.5%.

One way to decrease propagation delay is to increase $C_{gd}$. This increase, however, can take a lot of silicon area, especially because $C_{gd}$ may be increased significantly in order to scale with $C_{gs}$. In addition, $C_{gd}$ may be a high voltage capacitor, which can have a very low capacitance density. This approach may also increase current consumption and reduce efficiency as current sources 112 and 114 may be configured to produce greater currents.

As an alternative, drivers 110, in various embodiments, are configured to use respective current sources 114 and 116 to discharge the gates of transistors 120 at a faster initial rates until reaching a Miller plateau for the transistors 120. The drivers 110 are configured to then use only current sources 114 to discharge the gates at a slower subsequent rate after reaching the Miller plateau. In many instances, discharging a gate in this manner is a better solution for controlling propagation delay. When the Miller plateau for a transistor 120 has been reached, the drain-to-source voltage starts to move up or down with a rate dV/dt≈$I_{cgd}$/$C_{gd}$ (see, e.g., FIG. 3). In one embodiment, this rate is due to almost all current $I_{Miller}$ flowing into capacitor $C_{gd}$, and thus, the rate becomes dV/dt≈$I_{Miller}$/$C_{gd}$. A small portion of $I_{Miller}$ also flows into capacitor $C_{gs}$ to correct for finite transistor gain gm*$R_o$ (note: gm is transconductance; $R_o$ is output impedance). To illustrate the improvement in propagation delay, consider a recalculation of the example presented above. If, e.g., $I_{fast}$=10*$I_{Miller}$, then propagation delay is $T_{pdel}$ ($V_{DD}$−$V_{th}$)*$C_{gs}$/(10*$I_{Miller}$)+$T_{edge}$/2=10 ns+5 ns=15 ns, which is a much lower number and limits PWM modulation indexes to M=98.5%.

As will be described below, drivers 110 may be configured to implement operation of current sources 112, 114, and 116 using a variety of techniques in various embodiments shown in FIGS. 2, 4, 6, and 8. Drivers 110 may also use a variety of techniques to determine when a Miller plateau for a transistor 120 has been reached.

Figure 2:
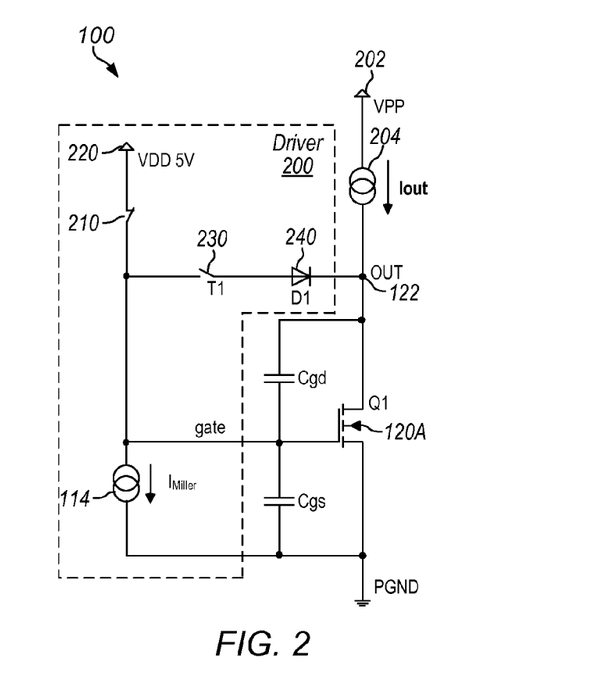
FIG. 2 is a block diagram illustrating one embodiment of a driver within an amplifier.

Turning now to FIG. 2, a block diagram of a driver 200 is depicted. Driver 200 is one embodiment of a driver 110 and, in the illustrated embodiment, corresponds to driver 110A. Other drivers 110B-D may also be configured in a similar manner as driver 200. As shown, driver 200 includes a switch 210, a voltage source $V_{DD}$ 220, switch 230, and diode 240. Driver 200 also includes current source 114A, which is shown to produce a current $I_{Miller}$. Driver 200 is coupled to transistor 120A, which, in turn, is coupled to capacitors $C_{gd}$ and $C_{gs}$, ground $P_{GND}$, and output node 122. Output node 122 is coupled to a current source 204 (e.g., representative of driver 110B and transistor 120B), which, in turn, is coupled to a voltage source $V_{PP}$ 202.

Switch 210 and voltage source 220, in one embodiment, are configured to charge the gate of transistor 120A. To charge the gate and, thus, turn transistor 120A on, driver 200 may be configured to open switch 230, disable current source 114A, and close switch 210 coupling voltage supply $V_{DD}$ 220 to the gate of transistor 120A. When the gate is charged (e.g., when the gate voltage is $V_{gate}$=5V, in one embodiment), the voltage at node 122 is $V_{out}=R_{onq1}*I_{out}$ (note: transistors 120A and 120B may also be referred to respectively as Q1 and Q2 in some instances; accordingly, $R_{onq1}$ is the resistance of transistor 120A from its drain to its source)

Switch 230, diode 240, and current source 114A, in one embodiment, are configured to discharge the gate of transistor 120A. To discharge the gate and, thus turn transistor 120A off, driver 200 may be configured to open switch 210, close switch 230, and enable current source 114A. These actions cause the gate of transistor 120 to be discharged very quickly at the first initial rate as current passes from the gate through diode 240. In such an embodiment, the discharge speed is limited by only diode 240's parasitic resistance and switch 230's parasitic resistance. Most of the current through diode 240 flows out through transistor 120A to ground (drain-source current of transistor 120A). As the gate voltage decreases, $R_{onq1}$ and $V_{out}$ increase accordingly. As a result, the gate discharge current through diode 240 goes substantially to zero as $V_{gate}=R_{onq1}*I_{out}\,V_{d1}(\sim 0\,A)=V_{th\_q1}+V_{dsat\_q1}$ ($I_{out}$). If the diode voltage drop is $V_{d1}(\sim 0\,A) \approx V_{th\_q1}$, then $R_{onq1}*I_{out}=V_{dsat\_q1}(I_{out})$ (note: diode 240 may also be referred to as d1, in some instances). This drop in current through diode 240 reduces the gate discharge rate to the slower subsequent rate when transistor 120A is at the boundary between the linear and saturation regions. As current source 114A continues to discharge the gate a little bit further, the Miller plateau is reached, and transistor 120 enters the saturation region. At this point, the output dv/dt is controlled purely by current source 114.

While driver 200 may have an improved PWM propagation delay in many instances, driver 200 may have some disadvantages. For example, the discharge speed may not be well controlled because it is determined by the series parasitic resistance of switch 230 and diode 240. Further, the diode voltage drop $V_{d1}$ at $I_{d1} \sim 0$ A does not match transistor 120's threshold voltage $V_{th}$ over process and temperature. The current through transistor 120 during the edge (shoot-through current) and dead time are also hard to control or preset. A truly isolated high-voltage diode is also difficult to manufacture in most integrated-circuit processes because an associated vertical PNP transistor (diode 240, in one embodiment, is a Base-Emitter junction of a PNP transistor) diverts a significant portion of diode current to the silicon substrate and potentially creates problems, such as latch-up, substrate noise, etc. Embodiments of driver 110, which mitigate these disadvantages, are described below in conjunction with FIGS. 4, 6, and 8.

Figure 3:
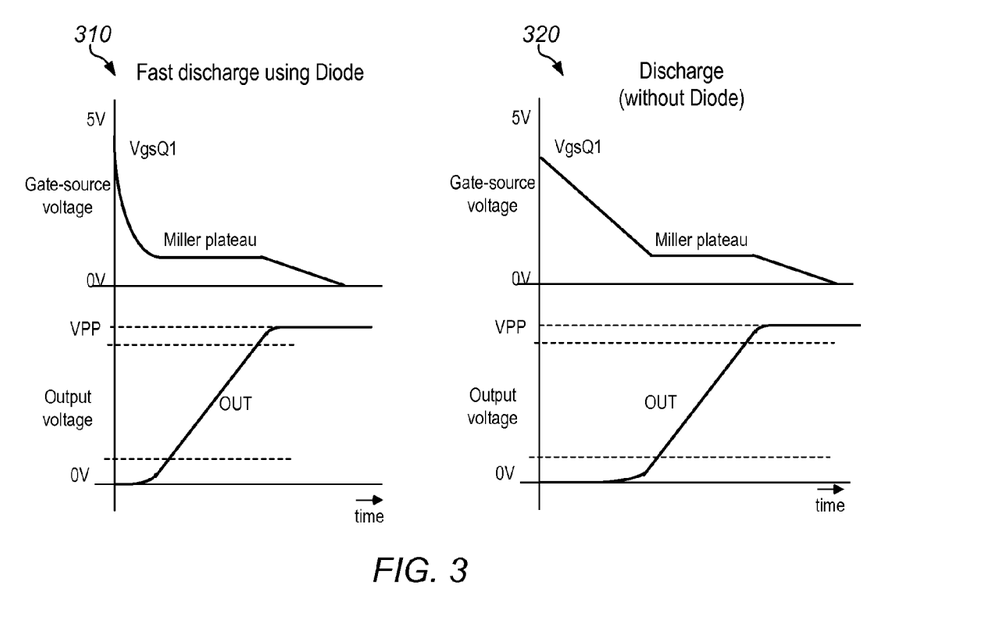
FIG. 3 is a set of graphs illustrating operation of embodiments of an amplifier.

Turning now to FIG. 3, a set of graphs 310 and 320 illustrating operation of embodiments of amplifier 200 is depicted. Graph 310 illustrates the gate-source voltage of transistor 120 and the voltage at node 122 (shown as "output voltage") when a faster initial discharge rate is used. As shown, the gate voltage drops quickly until reaching the Miller plateau and then drops at a slower rate afterwards. This quick initial drop shortens the overall PWM propagation delay. When the Miller plateau is reached, the dV/dt of output voltage stabilizes at a constant rate and changes after the plateau. In contrast, graph 320 illustrates the gate-source voltage of transistor 120 and the voltage at node 122 (shown as "output voltage") when only current source 114A is used to discharge the gate of transistor 120. As shown, the gate voltage drops more slowly until reaching the Miller plateau and then continues to drop at a slow rate afterwards. This slower drop creates a longer overall PWM propagation delay.

Figure 4:
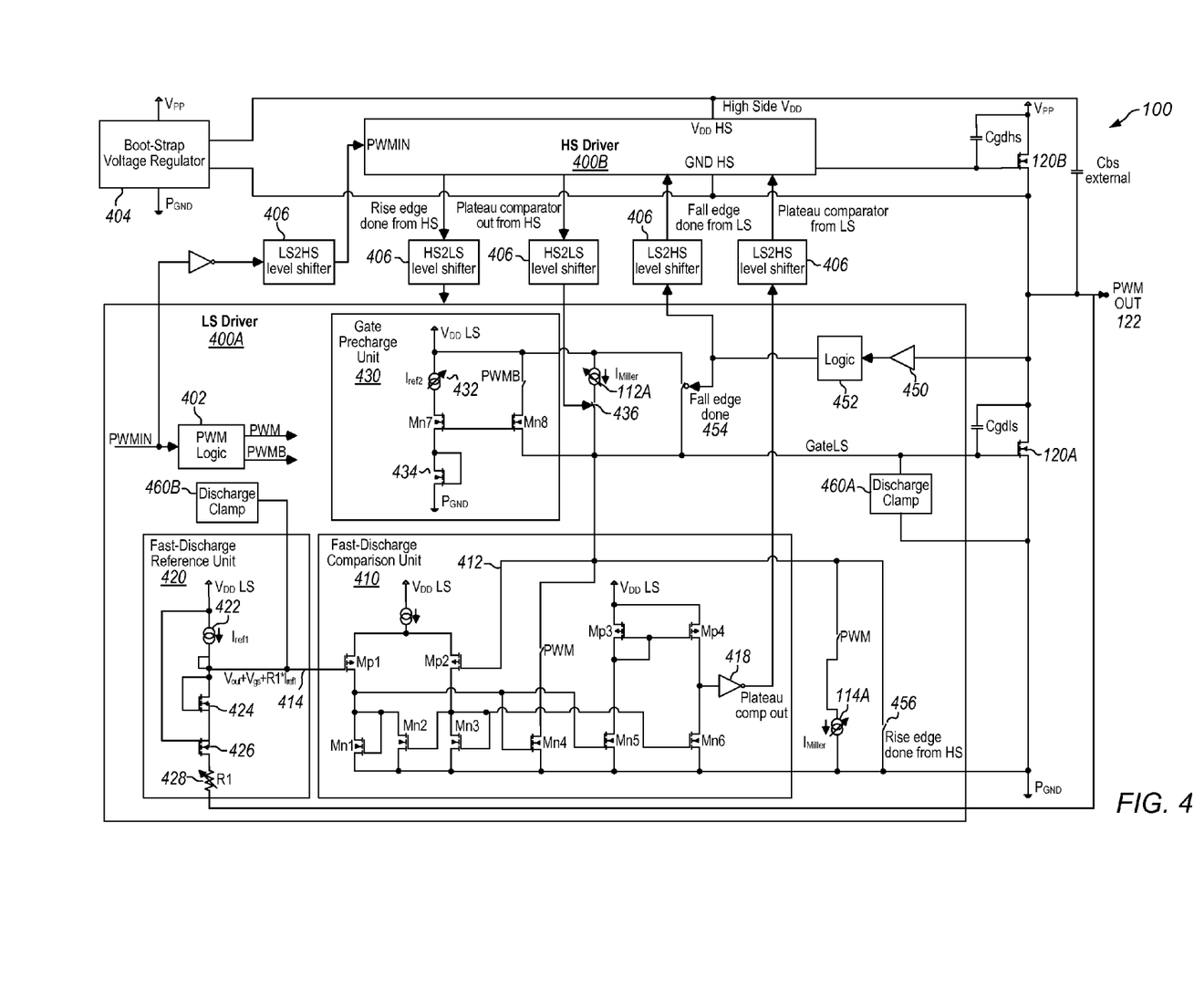
FIG. 4 is a block diagram illustrating one embodiment of low-side and high-side drivers within an amplifier.

Turning now to FIG. 4, a block diagram of a low-side driver 400A and a high-side driver 400B is depicted. Drivers 400 are another embodiment of drivers 110 and, in the illustrated embodiment, correspond respectively to driver 110A and 110B, which form one half of the H-bridge in amplifier 100. As will be described below, in various embodiments, drivers 400 are configured to discharge gates of transistors 120 at multiple different rates. In some embodiments, drivers 400 may also be configured to coordinate charging and discharging to minimize shoot-through current from passing through transistors 120.

In the illustrated embodiment, driver 400A includes PWM logic 402, fast-discharge comparison unit 410, a fast-discharge reference unit 420, a gate precharge unit 430, a comparator 450, logic 452, and discharge clamps 460A and 460B. Driver 400A also includes current sources 112A and 114A. Driver 400A is coupled to transistor 120A and driver 400B via low-side-to-high-side and high-side-to-low-side level shifters 406. In various embodiments, driver 400B is configured in a similar manner as driver 400A-thus, the internal structure of driver 400B is not depicted. Driver 400B, in turn, is coupled to boot-strap voltage regulator 404 and transistor 120B.

PWM logic 402, in one embodiment, is configured to control the operation of driver 400A based on a received input signal PWMIN. In the illustrated embodiment, PWM logic 402 is configured to output signal PWM and PWMB to cause switches PWM and PWMB to open and close. By closing and opening switches PWM and PWMB, PWM logic 402 controls the charging and discharging for the gates of transistors 120. In various embodiments, PWM logic 402 causes driver 400A to begin discharging the gate of transistor 120A when corresponding PWM logic 402 in driver 400B causes driver 400B to begin charging the gate of transistor 120B. Similarly, PWM logic 402 may cause driver 400A to begin charging the gate of transistor 120A when corresponding PWM logic 402 in driver 400B causes driver 400B to begin discharging the gate of transistor 120B.

Fast-discharge comparison unit 410, in one embodiment, is configured to discharge the gate of transistor 120A in conjunction with current source 114A at a faster initial rate until reaching the Miller plateau of transistor 120A. In the illustrated embodiment, comparison unit 410 includes transistors Mp1-4 and transistors Mn1-6. Transistors Mp1 and Mp2 are coupled to a current source, which is coupled to a voltage source $V_{DDLS}$. Transistors Mp3 and Mp4 are coupled to an inverter 418. Comparison unit 410 also includes a switch PWM. (In some instances, comparison unit 410 may correspond to switch 230 in FIG. 2.) In one embodiment, comparison unit 410 is configured to compare the gate voltage of transistor 120A (received via line 412) with a reference voltage (received via line 414) supplied by fast-discharge reference unit 420, and to discharge the gate of transistor 120A depending on the result of the comparison. Once the Miller plateau for transistor 120A is reached, comparison unit 410 is configured to stop discharging the gate, while current source 114A continues to discharge the gate at a slower subsequent rate until the upper edge of the pulse is reached (i.e., the voltage at node 122 is at $V_{PP}$ in one embodiment).

Fast-discharge reference unit 420, in one embodiment, is configured to provide a reference voltage to comparison unit 410 to control when unit 410 discharges the gate of transistor 120. In the illustrated embodiment, reference unit 420 includes a voltage source $V_{DDLS}$, current source 422, transistor 424, transistor 426, and adjustable resistor 428. In one embodiment, reference unit 420 is configured to generate a reference voltage of $V_{out}+V_{gs}+R_1*I_{ref1}$. (note: $V_{out}$ is the voltage at node 122, $V_{gs}$ is the gate voltage of transistor 120A, $R_1$ is the resistance of resistor 428, and $I_{ref1}$ is the current produced by current source 422).

In one embodiment, when PWMIN goes HIGH, the gate voltage of transistor 120A, for example, may be $V_{gs\_q1}$=5V, the gate voltage of transistor 120B may be $V_{gs\_q2}$=0V, and the voltage at node 122 may be $V_{out}$=$R_{onq1}$*$I_{load}$=LOW. As a result, fast-discharge comparison unit 410 may be enabled and starts to quickly discharge the gate of transistor 120A via a current through Mn4. In various embodiments, this current is K times higher than the current $I_{Miller}$ created by current source 114A, which is also ON and is discharging the gate of transistor 120A in parallel. In one embodiment, comparison unit 410 discharges the gate of transistor 120A until the gate voltage is $V_{gs\_q1}$=$V_{dsat\_q1}$+$V_{th\_q1}$=$R_{onq1}$*I(Q1)+$V_{th\_q3}$ (note: transistor 424 may also be referred to as Q3; $V_{th\_g3}$ is the threshold voltage of transistor 422). If $V_{th\_q1}$=$V_{th\_q3}$, then $R_{onq1}$*I(Q1)=$V_{dsat\_q1}$, which means that the gate discharge through Mn4 has stopped when transistor 120A is at the boundary between the linear and saturation regions. It is noted that, in some embodiments, the resistance of transistor 424 (also referred to as Q4) $R_{on\_q4}$ and $V_{dsat\_q3}$ are made small enough, so that those values are neglected. Also note that I(Q1)=$I_{load}$+$I_{shoot-through}$.

In one embodiment, the gate of Mn4 is instantly pulled low by Mn2 at the moment when the gate voltage of transistor is $V_{gs\_q1}$=$R_{onq1}$*I(Q1)+$V_{th\_q3}$. The current through Mn4 quickly stops, and current source 114A continues to discharge the gate alone. In one embodiment, the width and length (W/L) of Mn2 controls this exact moment when Mn4 is turned off. In some embodiments, this moment is also controlled by adjusting the offset voltage $R_1$*$I_{ref1}$. At the moment Mn4 turns off, the above equation including offset voltage $R_1$*$I_{rer1}$ becomes $V_{gs\_q1}$=$V_{dsat\_q1}$+$V_{th\_q1}$+$V_{offs}$=$R_{onq1}$*I(Q1)+$V_{th\_q3}$+$R_1$*$I_{ref1}$. In some embodiments, Mn4 is turned off sooner, by controlling Mn2 W/L or by adding R1*Iref1 offset in order to compensate for finite comparator speed and other effects. The fast discharge time may also be adjusted by changing Mn4 W/L.

Gate precharge unit 430, in one embodiment, is configured to charge the gate of transistor 120A in conjunction with current source 112A. In the illustrated embodiment, gate precharge unit 430 includes current source 432, switch PWMB, and transistors Mn7, Mn8, and 434. In one embodiment, precharge unit 430 is configured to charge the gate to a voltage below the threshold voltage of transistor 120A when driver 400B begins discharging the gate of transistor 120B. Afterwards, current source 112A, in one embodiment, is configured to charge the gate from this precharge voltage to $V_{DDLS}$—i.e., above the threshold voltage of transistor 120B.

In one embodiment, driver 400A is configured to cause current source 112A to begin charging the gate above the threshold voltage for transistor 120A in response to driver 400B indicating that the Miller plateau for transistor 120B has been reached during the discharge of transistor 120B's gate. In the illustrated embodiment, driver 400B is configured to instruct switch 436 to close causing current source 112A to begin charging. In one embodiment, a comparison unit 410 in driver 400B is configured to produce the indication that the Miller plateau for transistor 120B has been reached. In such an embodiment, the comparison unit 410 in driver 400A is configured to generate a similar indication when the Miller plateau for transistor 120A is reached during a discharge of its gate. Driver 400B is configured to activate a corresponding current source 122 to begin further charging the gate of transistor 120B in response to the indication from comparison unit 410. In one embodiment, comparison unit 410 is configured to produce this indication by converting the analog signal turning off Mn4 to logic levels using transistors Mn5, Mn6, Mp3, and Mp4, which form a comparator. The comparator output (shown as Plateau comp out) goes HIGH signaling that the Miller plateau for transistor 120A has been reached. This signal is used, after proper low-side to high-side (LS2HS) level shifting in a shifter 406, to turn on a corresponding current source 112B inside driver 400B. By initially precharing the gate of transistor 120A and waiting until receiving an indication from driver 400B before charging further, driver 400A, in various embodiments, controls $V_{PP}$ shoot-through current.

Comparator 450, in one embodiment, is configured to detect when the voltage of node 122 has reached about $P_{GND}$ (e.g., the lower edge of a pulse is about reached, in one embodiment), and to indicate the detection to logic 452. In one embodiment, logic 452 is configured to close switch 454 to connect the gate of transistor 120A to $V_{DDLS}$, and to instruct a switch (corresponding to switch 456) in driver 400B to couple the gate of transistor 120B to high-side ground. Similarly, in various embodiments, a corresponding comparator 450 in driver 400B is configured to detect when the voltage of node 122 has reached about $V_{PP}$ (e.g., the upper edge of a pulse is about reached, in one embodiment). Corresponding logic in driver 400B may be configured to connect the gate of transistor 120B to high side $V_{DD}$ and the gate of transistor 120 to $P_{GND}$. In various embodiments, comparator 450's output may also be used to turn-off some parts of the circuitry to save power in between PWM edges causing dynamic biasing.

Discharge clamp 460A and 460B, in one embodiment, are configured to clamp the voltages on lines 412 and 414, respectively, to prevent the voltages from being discharged below a particular level. In various embodiments, the description above is valid when the load current $I_{load}$ flowing into node 122 from device 130 is greater than or equal to 0 A. In case that $I_{load}$<0 A, the gate of transistor 120A may be discharged until $V_{gs\_g1}$=$V_{dsat\_q1}$+$V_{th\_q1}$=−$R_{onq1}$*I(Q1)+$V_{th\_q3}$. The negative term—Ronq1*I(Q1) indicates that the gate would be discharged to a very low voltage (much lower than $V_{th}$, especially at high load current) pinching off discharge current source 114A. In one embodiment, discharge clamps 460 are configured to prevent lines 412 and 414 from being discharged below the threshold voltage of transistor 120A if I(Q1)=~0 A for optimum circuit operation. Thus, the gate of transistor 120A may be discharged down to $V_{th}$ or only a little bit below without turning transistor 120A completely off during the PWM edge.

Figure 5:
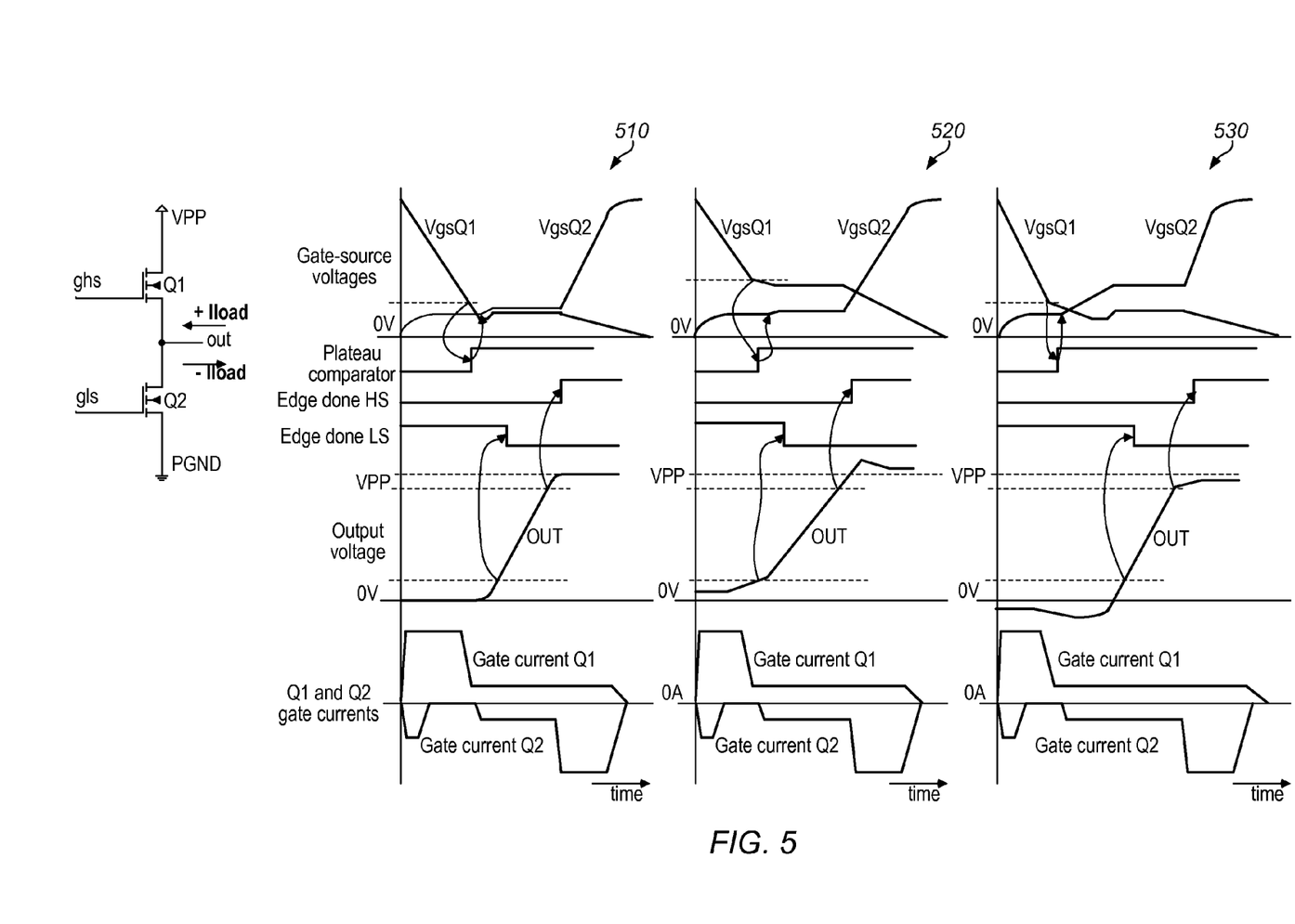
FIG. 5 is a set of graphs illustrating operation of embodiments of the low-side and high-side drivers in FIG. 4.

Turning now to FIG. 5, a set of graphs 510-530 illustrating operation of embodiments of the high side and low-side drivers 400 is depicted. As shown, graph 510 illustrates an example of the gates voltages of transistors 120A and 120B (shown as $V_{gsQ1}$ and $V_{gsQ2}$, respectively), the output voltage at node 122, and the gate currents of transistors 120A and 120B when the current through node 122 (shown as $I_{load}$) is 0 A. In graph 510, the gate of transistor 120A is quickly discharged until reaching a Miller plateau. At this point, the plateau comparator signal produced by comparison unit 410 goes high (e.g., at inverter 418), and the gate of transistor 120B is charged above its threshold voltage. Accordingly, the output voltage at node 122 starts at around 0V and steadily rises as transistor 120A's gate is discharged and transistor 120B's gate is charged. The output of a comparator 450 in driver 400A is initially high until the output voltage at node 122 exceeds a value above 0V. The output of a comparator 450 in driver 400B is initially low until the output voltage reaches a value about $V_{PP}$. Graphs 520 and 530 depict similar examples when the current though node 122 is positive or negative, respectively.

Figure 6:
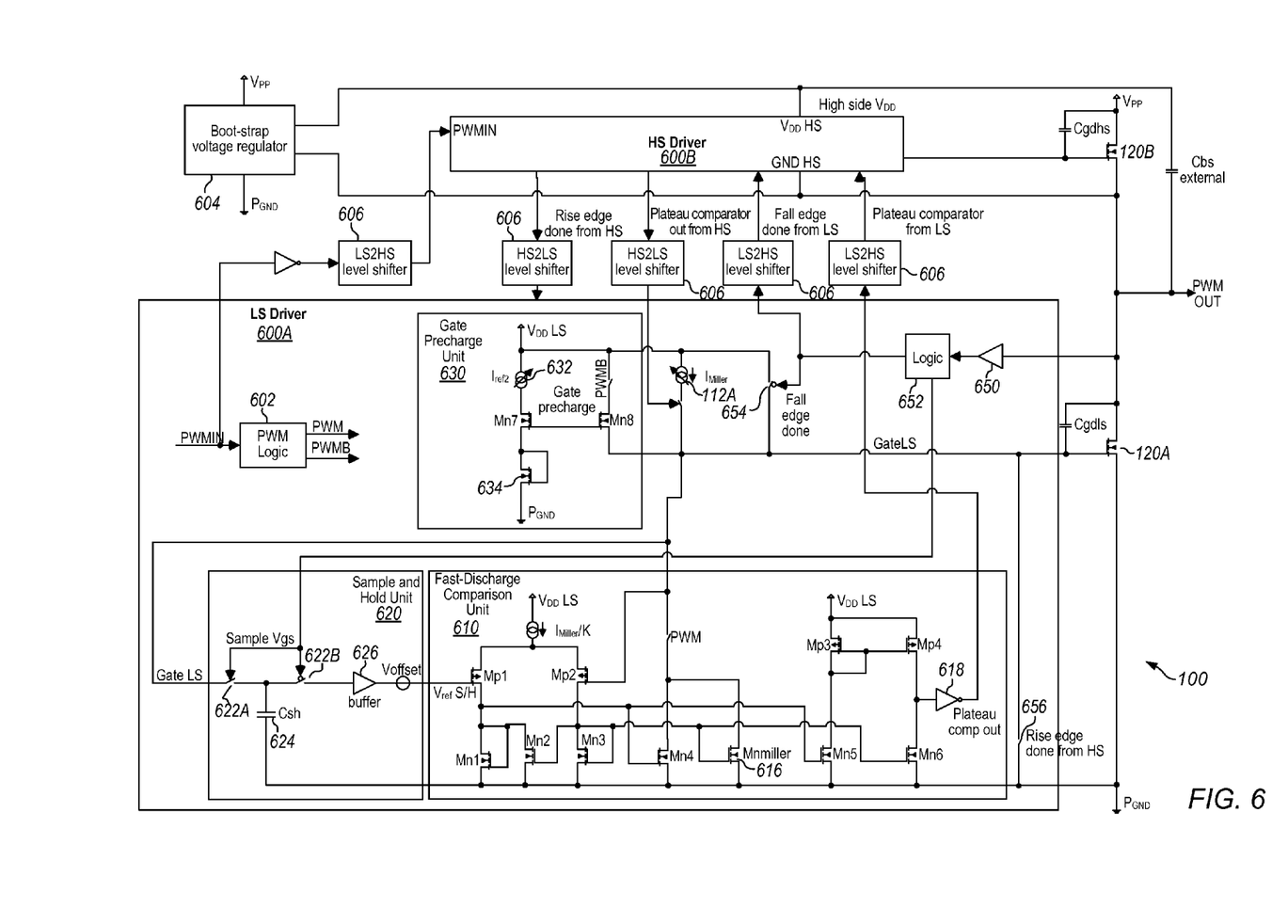
FIG. 6 is a block diagram illustrating another embodiment of low-side and high-side drivers within an amplifier.

Turning now to FIG. 6, a block diagram of low-side driver 600A and high-side driver 600B is depicted. Drivers 600 are yet another embodiment of drivers 110 and, in the illustrated embodiment, correspond respectively to driver 110A and 110B, which form one half of the H-bridge in amplifier 100. As will be described below, in various embodiments, drivers 600 may use a sample and hold unit configured to provide a reference voltage for the comparison unit, instead of using a fast-discharge reference unit, such as unit 420 described above.

In the illustrated embodiment, driver 600A includes PWM logic 602, fast-discharge comparison unit 610, a sample and hold unit 620, a gate precharge unit 630, a comparator 650, logic 652, and current source 112A. Driver 600A is coupled to transistor 120A and to driver 600B via level shifters 606. In various embodiments, driver 600B is configured in a similar manner as driver 600A—thus, the internal structure of driver 600B is not depicted. Driver 600B, in turn, is coupled to boot-strap voltage regulator 604 and transistor 120B.

Fast-discharge comparison unit 610, in one embodiment, is configured to discharge the gate of transistor 120A. In the illustrated embodiment, comparison unit 610 includes transistors Mp1-4, transistors Mn1-6, transistor Mnmiller 616. Transistors Mp1 and Mp2 are coupled to a current source, which is coupled to a voltage source $V_{DDLS}$. Transistors Mp3 and Mp4 are coupled to an inverter 618. Comparison unit 610 also includes a switch PWM. In various embodiments, comparison unit 610 may be configured in a similar manner as comparison unit 410. In one embodiment, transistor 616 is configured to function in a similar manner as current source 114A.

Sample and hold unit 620, in one embodiment, is configured to provide a reference voltage to comparison unit 610 to control when unit 610 discharges the gate of transistor 120 at a faster initial rate and at a slower subsequent rate. In the illustrated embodiment, sample and hold unit 620 includes switches 622A and 622B, capacitor 624, and buffer 626. In one embodiment, sample and hold unit 620 is configured to sample the gate voltage of transistor 120A during a first pulse width modulation (PWM) cycle, and to provide the sampled voltage during a second PWM cycle for use by comparison unit 610 in determining the moment when to disconnect fast gate discharge current flowing through Mn4 and to switch to current flowing through transistor 616. In many instance, the error due to one PWM cycle delay is small because sample and unit 620 may have a high PWM over-sampling ratio. In one embodiment, $V_{offset}$ is introduced to stop fast discharge before the Miller plateau is reached in order to account for a finite comparator speed and errors due to one PWM cycle delay. As will be described below, comparator 650 and logic 652 may be configured to coordinate unit 620's sampling of transistors 120A's gate voltage.

Gate precharge unit 630, in one embodiment, is configured to charge the gate of transistor 120A in conjunction with current source 112A. In the illustrated embodiment, gate precharge unit 630 includes current source 632, switch PWMB, and transistors Mn7, Mn8, and 634. In various embodiments, precharge unit 630 may be configured to function in a similar manner as unit 430 described above.

Comparator 650, in one embodiment, is configured to detect when the voltage of node 122 has reached about $P_{GND}$ (e.g., the lower edge of a pulse is about reached, in one embodiment), and to indicate the detection to logic 652. In various embodiments, logic 652 is configured to control switches 654 and 656 in a similar manner as logic 452 controls switches 454 and 456 described above. In one embodiment, logic 652 is further configured to cause sample and hold unit 620 to sample transistor 120A's gate voltage based on comparator 650's indication. To sample the gate voltage, logic 652, in one embodiment, is configured to open switch 622A to stop capacitor 624 from tracking the gate voltage of transistor 120A. In one embodiment, logic 652 causes unit 620 to sample the gate voltage on the rising PWM edge as transistor 120A is in saturation and its gate voltage is in a flat Miller plateau region during a charge of the gate. In one embodiment, logic 652 is further configured to close switch 622B to provide the sampled voltage to comparison unit 610 via buffer 626

Figure 7:
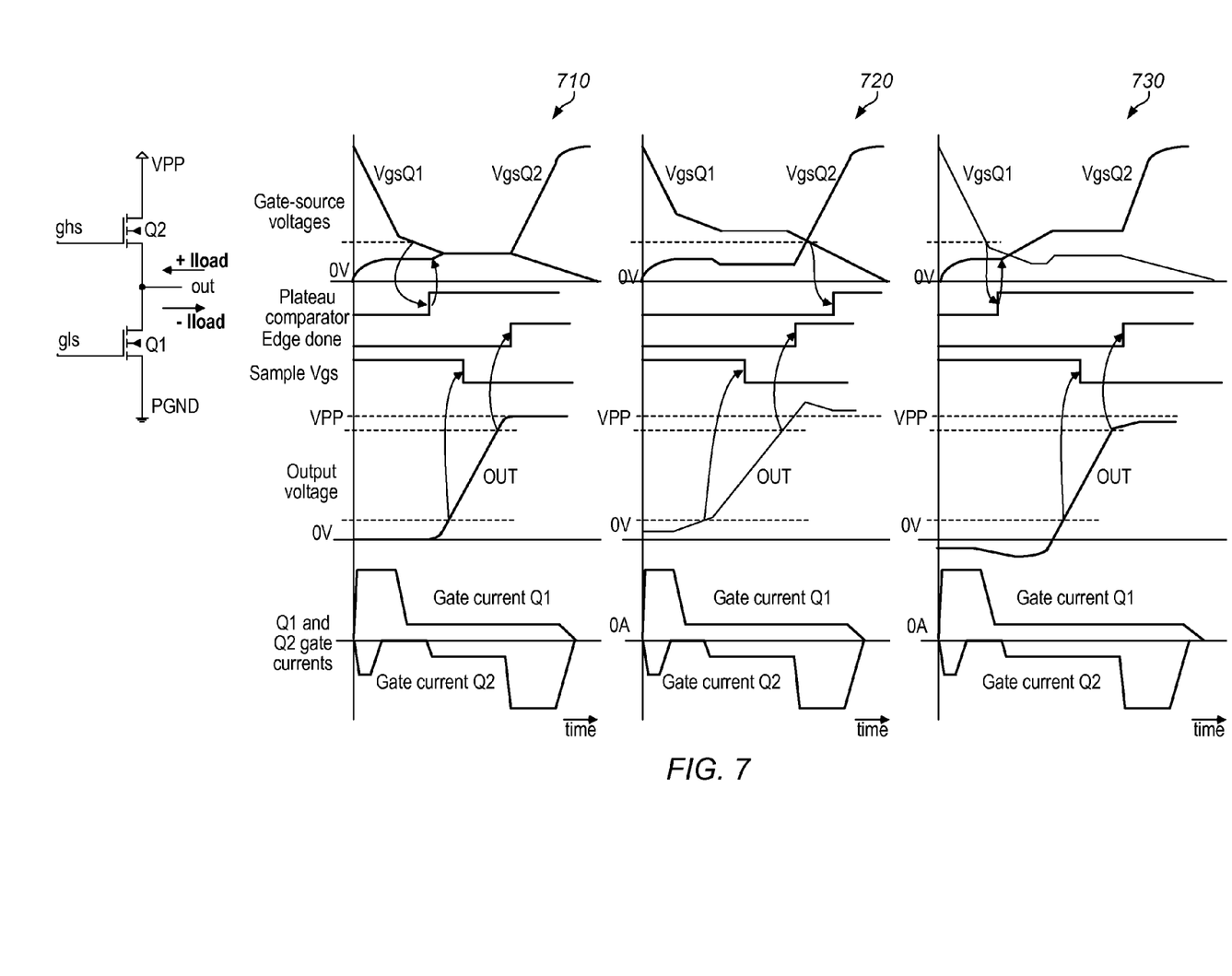
FIG. 7 is a set of graphs illustrating operation of embodiments of the low-side and high-side drivers in FIG. 6.

Turning now to FIG. 7, a set of graphs 710-730 illustrating operation of embodiments of the high side and low-side drivers 600 is depicted. As shown, graph 710 illustrates an example of the gates voltages of transistors 120A and 120B, the output voltage at node 122, and the gate currents of transistors 120A and 120B when the current through node 122 is 0 A. In graph 710, the gate of transistor 120A is quickly discharged until reaching a Miller plateau. At this point, the plateau comparator signal produced by comparison unit 610 (shown as Plateau comparator) goes high, and the gate of transistor 120B is charged above its threshold voltage. Accordingly, the output voltage at node 122 starts at around 0V and steadily rises as transistor 120A's gate is discharged and transistor 120B's gate is charged. In the illustrated embodiment, the output of comparator 650 in driver 600A (shown as Sample $V_{gs}$) is initially high until the output voltage at node 122 exceeds a value above 0V. When the output falls, sample and hold unit 620 opens switch 622A storing the voltage in capacitor 624. The output of a comparator 650 in driver 600B (shown as edge done) is initially low until the output voltage reaches a value about $V_{PP}$. Graphs 720 and 730 depict similar examples when the current though node 122 is positive or negative, respectively.

Figure 8:
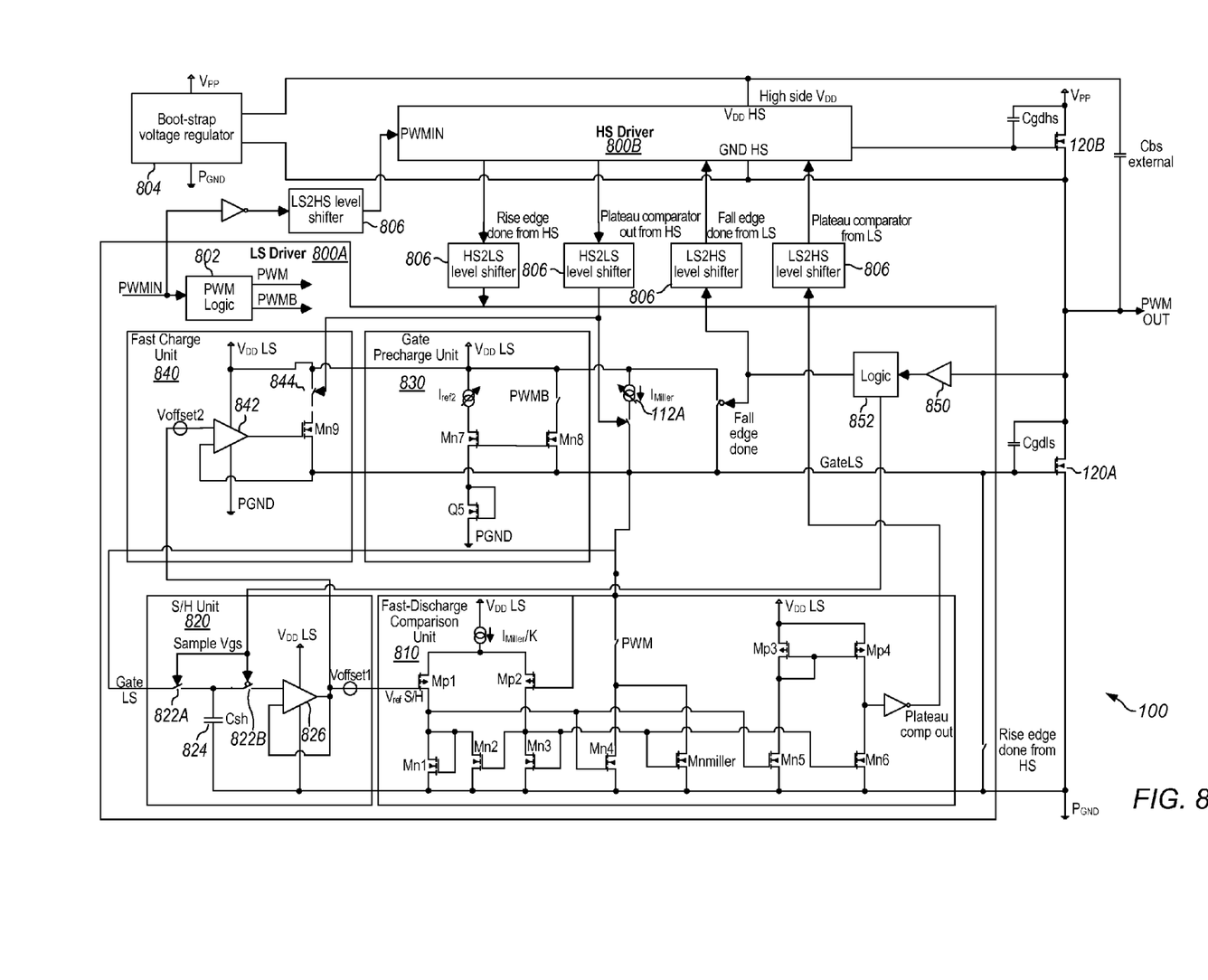
FIG. 8 is a block diagram illustrating yet another embodiment of low-side and high-side drivers within an amplifier.

Turning now to FIG. 8, a block diagram of low-side driver 800A and high-side driver 800B is depicted. Drivers 800 are yet another embodiment of drivers 110 and, in the illustrated embodiment, correspond respectively to driver 110A and 110B, which form one half of the H-bridge in amplifier 100. As will be described below, in various embodiments, drivers 800 may be configured to charge gates of transistors 120 at multiple different rates. In one embodiment, driver 800A is configured to precharge the gate of transistor 120A to a voltage below its threshold voltage, and to wait until the Miller plateau for transistor 120B has been reached as it is being discharged. Once the Miller plateau for transistor 120B is reached, driver 800A may be configured to charge transistor 120A's gate above its threshold voltage at a faster initial rate until reaching the miller plateau of transistor 120A. Driver 400A may be configured to then charge a slower subsequent rate using only current source 112A. Driver 800B may be configured to function in a similar manner.

In the illustrated embodiment, driver 800A includes PWM logic 802, fast-discharge comparison unit 810, a sample and hold unit 820, a gate precharge unit 830, a fast charge unit 840, a comparator 850, and current source 112A. Driver 800A is coupled to transistor 120A and to driver 800B via level shifters 806. In various embodiments, driver 800B is configured in a similar manner as driver 800A—thus, the internal structure of driver 800B is not depicted. Driver 800B, in turn, is coupled to boot-strap voltage regulator 804 and transistor 120B.

Fast-discharge comparison unit 810, in one embodiment, is configured to discharge the gate of transistor 120A in a similar manner as comparison units 410 and 610 described above. As discussed above, comparison unit 810, in one embodiment, is configured to indicate, to driver 800B, when the discharging of transistor 120A's gate has reached the Miller Plateau for transistor 120A. As will be described below, driver 800A may be configured to receive a similar signal from driver 800B, and to use the signal to activate fast charge unit 840 and current source 112A.

Sample and hold unit 820, in one embodiment, is configured to sample the gate voltage of transistor 120A on a rising PWM edge during a first cycle, and to provide the sampled voltage to comparison unit 810 during the discharging of transistor 120A's gate during a second cycle. In the illustrated embodiment, sample and hold unit 820 includes switches 822A and 822B, capacitor 824, analog buffer 826. In various embodiments, sample and hold unit 820 is configured to function in a similar manner during a discharge as sample and hold unit 620 described above. In one embodiment, sample and hold unit 820 is further configured to provide the sampled voltage to fast charge unit 840 in order for unit 840 to determine when the Miller plateau of transistor 120A has been reached. In the illustrated embodiment, unit 820 provides the signal via buffer 826.

Gate precharge unit 830, in one embodiment, is configured to charge the gate of transistor 120A in conjunction with current source 112A and fast charge unit 840. In various embodiments, gate precharge unit 830 may be configured to function in a similar manner as units 430 and 630. As discussed above, in one embodiment, gate precharge unit 830 is configured to charge the gate of transistor 120A to a voltage just below the threshold voltage of transistor 120A. Gate precharge unit 830 may be configured to begin charging transistor 120A as driver 800B begins discharging transistor 120B.

Fast charge unit 840, in one embodiment, is configured to charge the gate of transistor 120A from the voltage below the threshold voltage to the point at which the Miller plateau of transistor 120A is reached. In various embodiments, fast charge unit 840 is configured to charge the gate simultaneously with current source 112A to achieve a faster initial charge rate. In the illustrated embodiment, fast charge unit 840 includes voltage source $V_{DDLS}$, $P_{GND}$, comparator 842, switch 844, and transistor Mn9. In one embodiment, comparator 842 is configured to use the sampled voltage to determine when the Miller plateau has been reached and to then discontinue charging the gate of transistor 120A. In one embodiment, switch 844 is closed by driver 800B (via a corresponding comparator unit 810) to enable fast charge unit 840 when the Miller plateau for transistor 120B has been reached. In one embodiment, current source 112A continues to charge the gate of transistor 120A alone at a slower subsequent rate once the Miller plateau for transistor 120A has been reached.

Comparator 850, in one embodiment, is configured to detect when the voltage of node 122 has reached about $P_{GND}$ (i.e., the lower edge of a pulse is about reached), and to indicate the detection to logic 852, which is configured to couple the gate of transistor 120B to $V_{DDLS}$. Logic 852 may also be configured to cause driver 800B to couple the gate of transistor 120B to high-side ground. In one embodiment, this coupling may mark then end of the charging phase. In various embodiments, comparator 850 and logic 852 are configured in a similar manner as units 650 and 450 and logic 452 and 652.

In one embodiment, the operation of drivers 800 can be explained, for example, on PWM output rising edge at which the gate of transistor 120B is being charged up. (As noted above, in some embodiments, drivers 800 may have identical circuitry.) Consider the waveforms in graph 730. First the gate of transistor 120B is precharged using a gate precharge unit 830 in driver 800B, which then waits for a command from driver 800A signaling that transistor 120A's gate was discharged to the Miller plateau (plateau comparator signal from comparison unit 810). Once the plateau signal arrives, a current source 112B and a transistor Mn9 in driver 800B are driven by a comparator 842, which turns on, charging up the gate until gate voltage approaches the charge up plateau. When the plateau is being approached Mn9 follower starts to carry less and less current. The exact moment when Mn9 turns off can be tweaked by Voffset2 voltage offset. Ideally, during the Miller plateau, the Mn9 current is close to zero, so that only current from current source 112B determines the output PWM edge dv/dt. By using fast charge unit 840, the propagation delay may be even less dependent on load current, and the open loop THD is further improved in many instances.

It is noted that fast charge unit 840 may also be used in conjunction with fast-discharge comparator reference unit (such as unit 420) described above. Said another way, in some embodiments, drivers 800 may include a comparator reference unit instead of sample and hold unit 820.

Figure 9:
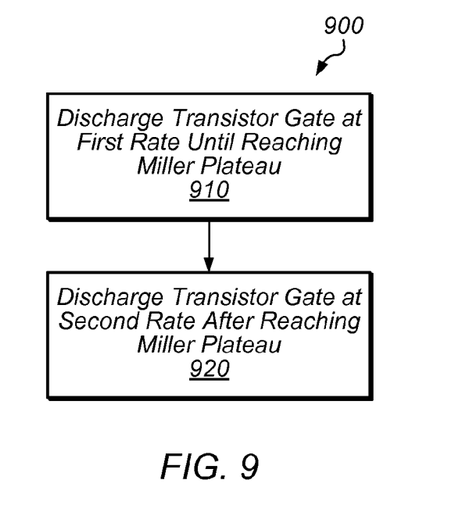
FIG. 9 is a flow diagram illustrating one embodiment of a method for discharging a gate of a transistor.

Turning now to FIG. 9, a flow diagram of a method 900 for discharging transistors (e.g., transistors 120) is depicted. Method 900 is one embodiment of a method that may be performed by an amplifier, such as amplifier 100. In various embodiments, method 900 may be performed multiple times by multiple drivers in the amplifier. In many instances, performing method 900 may reduce electromagnetic interference (due to shoot-through current and minimum dead-time) and total harmonic distortion by producing pulses that have a shorter and more-linear propagation delay.

In step 910, amplifier 100 (e.g., using a driver 110) discharges a transistor gate (e.g., of a transistor 120) at a first rate until reaching a Miller plateau for the transistor. In one embodiment, amplifier 100 uses first and second current sources (e.g., current sources 114 and 116, respectively; current source 114 and transistor Mn4, respectively; transistors Mnmiller and Mn4, respectively) to discharge the gate at the first rate. In some embodiments, amplifier 100 discharges the gate at the first rate by discharging (e.g., using a path that includes diode 240) a portion of the gate's charge through a drain of the transistor and another portion of the gate's charge into a capacitor (e.g., capacitor $C_{gd}$) coupled to a drain of the transistor and the gate.

In step 920, amplifier 100 discharges the gate at a second rate after reaching the Miller plateau, the first rate being greater than the second rate. In one embodiment, amplifier 100 uses a first current source to discharge the gate at the second rate, but does not use a second current source that was used in conjunction with the first current source to discharge the gate at the first rate. In one embodiment, amplifier 100 changes from discharging the gate at the first rate to discharging the gate at the second rate in response to determining that the Miller plateau for the transistor has been reached. In one embodiment, amplifier 100 (e.g., using a comparison unit 410, 610, 810) determines this by comparing a voltage of the gate with a reference voltage that tracks a saturation voltage and a threshold voltage of the transistor. In some embodiments, amplifier 100 (e.g., using a driver 400) generates the reference voltage by using another transistor (e.g., transistor 424) that has a threshold voltage that tracks the threshold voltage of (i.e., has a similar thresh voltage to) the transistor. In other embodiments, amplifier 100 (e.g., using a driver 600 or 800) generates the reference voltage by sampling a voltage of the gate during a first pulse width modulation (PWM) cycle and using the sampled voltage as the reference voltage during a second PWM cycle. In one embodiment, amplifier 100 (e.g., using comparator 650 or 850) compares a voltage at a drain of the transistor with a threshold voltage to determine when to sample the voltage of the gate during the first PWM cycle. In one embodiment, amplifier 100 (e.g., using discharge clamps 460) prevents the driver from discharging the gate below a particular threshold voltage.

Figure 10:
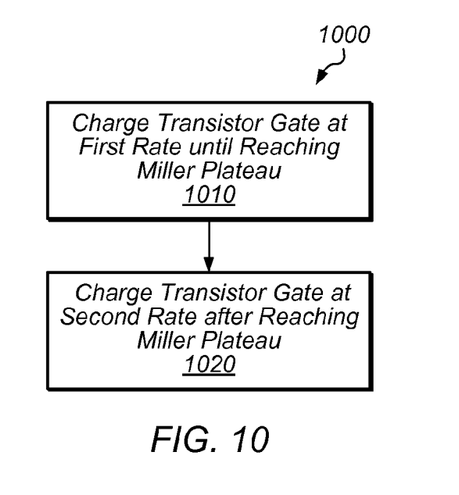
FIG. 10 is a flow diagram illustrating one embodiment of a method for charging a gate of a transistor.

Turning now to FIG. 10, a flow diagram of a method 1000 for charging transistors (e.g., transistors 120) is depicted. Method 1000 is one embodiment of a method that may be performed by an amplifier, such as amplifier 100. In various embodiments, method 1000 may be performed multiple times by multiple drivers in the amplifier. Method 1000 may also be performed in conjunction with method 900. In many instances, performing method 1000 may reduce electromagnetic interference and total harmonic distortion by producing pulses that have a shorter and more-linear propagation delay.

In step 1010, amplifier 100 charges a transistor gate at first rate until reaching a Miller plateau for the transistor. In one embodiment, amplifier 100 charges the transistor gate at the first rate by using both a first power source (e.g., current source 112) and a second power source (e.g., fast charge unit 840). In one embodiment, amplifier 100 begins charging the gate of the transistor (e.g., using precharge unit 830) to a voltage below the threshold voltage when the amplifier 100 begins discharging the gate of another transistor (e.g., by performing an instance of method 900). In some embodiments, amplifier 100 waits to charge the gate of the transistor above the threshold voltage until the Miller plateau for the other transistor has been reached, such as in method 1100 described below.

In step 1020, amplifier 100 charges the transistor gate at a second rate after reaching the Miller plateau. In one embodiment, amplifier 100 determines that the Miller plateau has been reached by comparing a gate voltage of the transistor with a reference voltage that tracks the saturation voltage and the threshold voltage of the transistor. In some embodiments, amplifier 100 (e.g., using fast-discharge reference unit 420) generates the reference voltage by using another transistor (e.g., transistor 424) that tracks the threshold voltage of the transistor. In some embodiments, amplifier 100 (e.g., using sample and hold unit 620 or 820) generates the reference voltage by sampling the gate voltage during a first pulse width modulation (PWM) cycle and using the sampled voltage as the reference voltage during a second PWM cycle.

Figure 11:
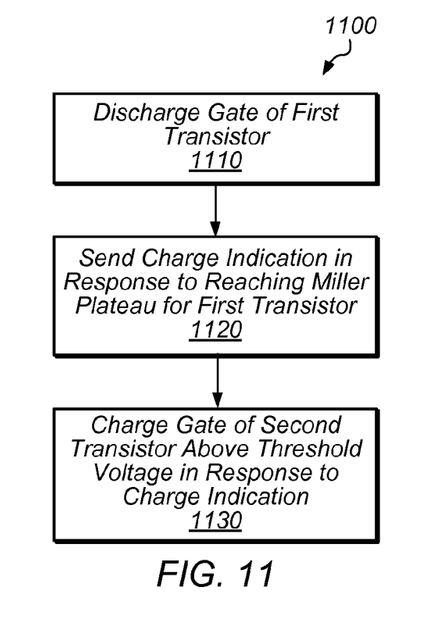
FIG. 11 is a flow diagram illustrating one embodiment of another method for charging a gate of a transistor.

Turning now to FIG. 11, a flow diagram of a method 1100 for coordinating discharging and charging transistors (e.g., transistors 120) is depicted. Method 1100 is one embodiment of a method that may be performed by an amplifier, such as amplifier 100. In various embodiments, method 1100 may be performed multiple times by multiple drivers in the amplifier. In many instances, performing method 1100 may reduce heat, power consumption, and electromagnetic interference in an amplifier by reducing shoot-though current.

In step 1110, a first driver of amplifier 100 (e.g., driver 110A) discharges a gate of a first transistor (e.g., transistor 120A). In some embodiments, the first driver discharges the gate at a constant rate. In other embodiments, the first driver discharges the gate of the first transistor at a first rate until reaching the Miller plateau for the first transistor and at a second rate after reaching the Miller plateau, such as described above.

In step 1120, the first driver (e.g., using one of comparison units 410, 610, or 810) sends a charge indication to a second driver of amplifier 100 (e.g., driver 110B) in response to reaching a Miller plateau for the first transistor. In one embodiment, the first driver determines that the Miller plateau for the first transistor has been reached, by comparing a voltage at the gate of the first transistor with a reference voltage, such as described above. In some embodiments, the first driver sends the charge indication to the second driver via the level shifter.

In step 1130, the second driver charges a gate of a second transistor (e.g., transistor 120B) above a threshold voltage in response to receiving the charge indication. In one embodiment, the second driver (e.g., using precharging unit 430, 630, or 830) begins charging the gate of the second transistor to a voltage below the threshold voltage when the first driver begins discharging the gate of the first transistor. The second driver then waits to charge the gate of the second transistor above the threshold voltage until the charge indication has been received. In one embodiment, the second driver activates, in response to receiving the charge indication, a current source (e.g., current source 112) that charges the gate of the second transistor above the threshold voltage. In some embodiments, the second driver (e.g., using comparator 450, 650, or 850) also instructs the first driver to couple the gate of the first transistor to ground in response to the second driver detecting an upper PWM edge (or lower PMW edge) such as described above.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a first driver; and
   a second driver;
   wherein the first driver is configured to discharge a gate of a first transistor, and wherein the first driver is configured to send a charge indication to the second driver in response to reaching a Miller plateau for the first transistor;
   wherein the second driver is configured to charge a gate of a second transistor above a threshold voltage in response to receiving the charge indication.

2. The apparatus of claim 1, wherein the apparatus is a class D amplifier, and wherein the first and second transistors form half of an H bridge of the amplifier.

3. The apparatus of claim 1, wherein the second driver is configured to:
   begin charging the gate of the second transistor to a voltage below the threshold voltage when the first driver begins discharging the gate of the first transistor; and
   wait to charge the gate of the second transistor above the threshold voltage until the charge indication has been received.

4. The apparatus of claim 1, wherein the second driver includes a current source that is configured to charge the gate of the second transistor above the threshold voltage, and wherein the second driver is configured to activate the current source in response to receiving the charge indication.

5. The apparatus of claim 1, wherein the first driver is configured to determine that the Miller plateau for the first transistor has been reached, by comparing a voltage at the gate of the first transistor with a reference voltage.

6. The apparatus of claim 5, wherein the first driver is configured to generate the reference voltage based on a threshold voltage of the first transistor and a voltage of a drain of the first transistor.

7. The apparatus of claim 5, wherein the first driver is configured to generate the reference voltage by sampling a voltage of the gate during a first pulse width modulation (PWM) cycle and using the sampled voltage as the reference voltage during a second PWM cycle.

8. The apparatus of claim 1, wherein the second driver is configured to charge the gate of the second transistor at first rate until reaching a Miller plateau for the second transistor, and wherein the second driver is configured to charge the gate of the second transistor at a second rate after reaching the Miller plateau for the second transistor, wherein the first rate is greater than the second rate.

9. The apparatus of claim 8, wherein the second driver is configured to determine that the Miller plateau for the second transistor has been reached by comparing a voltage of the second transistor's gate with a reference voltage, and wherein the second driver is configured to generate the reference voltage by sampling a voltage of the second transistor's gate during a charge of the second transistor's gate.

10. The apparatus of claim 1, wherein the second driver is configured to instruct the first driver to couple the gate of the first transistor to ground in response to the second driver detecting an upper PWM edge.

11. The apparatus of claim 1, further comprising:
a level shifter configured to shift a voltage of a signal;
wherein the first driver is configured to send the charge indication to the second driver via the level shifter.

12. The apparatus of claim 1, wherein the first driver is configured to discharge the gate of the first transistor at a first rate until reaching the Miller plateau for the first transistor, and wherein the first driver is configured to discharge the gate of the first transistor at a second rate after reaching the Miller plateau, wherein the first rate is greater than the second rate.

13. The apparatus of claim 1, wherein the second driver is configured to discharge the gate of the second transistor, and wherein the second driver is configured to send another charge indication to the first driver in response to reaching a Miller plateau for the second transistor;
wherein the first driver is configured to charge the gate of the first transistor above a threshold voltage in response to receiving the other charge indication.

14. An apparatus, comprising:
an amplifier configured to use first and second transistors to drive an output at a node, wherein the amplifier is configured to discharge a gate of the first transistor, and wherein the amplifier is configured to charge a gate of a second transistor above a threshold voltage in response to reaching a Miller plateau for the first transistor; and
wherein the amplifier is configured to charge the gate of the second transistor at first rate until reaching a Miller plateau for the second transistor, and wherein the amplifier is configured to charge the gate of the second transistor at a second rate after reaching the Miller plateau for the second transistor, wherein the first rate is greater than the second rate.

15. The apparatus of claim 14, wherein the amplifier is configured to begin charging the gate of the second transistor to a voltage below the threshold voltage when the amplifier begins discharging the gate of the first transistor, and wherein the amplifier is configured to wait to charge the gate of the second transistor above the threshold voltage until reaching the Miller plateau for the first transistor.

16. The apparatus of claim 14, wherein the amplifier is configured to couple the gate of the first transistor to ground in response to detecting an upper PWM edge.

17. A method, comprising:
a first driver of an amplifier discharging a gate of a first transistor;
the first driver sending a charge indication to a second driver of the amplifier in response to reaching a Miller plateau for the first transistor; and
the second driver charging a gate of a second transistor above a threshold voltage in response to receiving the charge indication.

18. The method of claim 17, further comprising:
the second driver beginning charging of the gate of the second transistor to a voltage below the threshold voltage when the first driver begins discharging the gate of the first transistor; and
the second driver waiting to charge the gate of the second transistor above the threshold voltage until reaching the Miller plateau for the first transistor.

19. The method of claim 17, further comprising:
the second driver discharging the gate of the second transistor;
the second driver sending another charge indication to the first driver in response to reaching a Miller plateau for the second transistor; and
the first driver charging the gate of the first transistor above a threshold voltage in response to receiving the other charge indication.

* * * * *